United States Patent
Tamaso

(10) Patent No.: US 9,620,358 B2
(45) Date of Patent: Apr. 11, 2017

(54) METHOD FOR MANUFACTURING SILICON CARBIDE SEMICONDUCTOR DEVICE

(71) Applicant: Sumitomo Electric Industries, Ltd., Osaka-shi (JP)

(72) Inventor: Hideto Tamaso, Osaka (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 0 days.

(21) Appl. No.: 14/892,972

(22) PCT Filed: May 8, 2014

(86) PCT No.: PCT/JP2014/062311
§ 371 (c)(1),
(2) Date: Nov. 20, 2015

(87) PCT Pub. No.: WO2014/199749
PCT Pub. Date: Dec. 18, 2014

(65) Prior Publication Data
US 2016/0118250 A1 Apr. 28, 2016

(30) Foreign Application Priority Data

Jun. 13, 2013 (JP) ................................ 2013-124657

(51) Int. Cl.
*H01L 21/02* (2006.01)
*H01L 21/027* (2006.01)
(Continued)

(52) U.S. Cl.
CPC .... *H01L 21/02529* (2013.01); *H01L 21/0274* (2013.01); *H01L 22/12* (2013.01);
(Continued)

(58) Field of Classification Search
CPC ........... H01L 29/1608; H01L 21/02529; H01L 2924/0002; H01L 29/7802; H01L 21/3065;
(Continued)

(56) References Cited

U.S. PATENT DOCUMENTS 5,072,266 A * 12/1991 Bulucea .............. H01L 29/0696
257/330
6,853,006 B2 * 2/2005 Kataoka ................ H01L 29/045
257/192

(Continued)

FOREIGN PATENT DOCUMENTS

JP H04-255211 A 9/1992
JP H08-306602 A 11/1996
(Continued)

OTHER PUBLICATIONS

International Search Report in PCT International Application No. PCT/JP2014/062311, dated Jul. 15, 2014.
(Continued)

*Primary Examiner* — Evren Seven
*Assistant Examiner* — S. M. S Imtiaz
(74) *Attorney, Agent, or Firm* — Venable LLP; Michael A. Sartori; F. Brock Riggs

(57) ABSTRACT

A method for manufacturing a silicon carbide semiconductor device includes the following steps. There is prepared a first silicon carbide layer having a first main surface and a second main surface. A first recess including a side portion and a bottom portion is formed in the first main surface of the first silicon carbide layer. A second silicon carbide layer is formed in contact with the first main surface, the side portion, and the bottom portion. An image of a second recess formed at a position facing the first recess of the fourth main surface is obtained. Alignment is performed based on the
(Continued)

image of the second recess. The first main surface corresponds to a plane angled off relative to a {0001} plane. A ratio obtained by dividing a depth of the first recess by a thickness of the second silicon carbide layer is more than 0.2.

8 Claims, 13 Drawing Sheets

(51) Int. Cl.
| | |
|---|---|
| *H01L 29/16* | (2006.01) |
| *H01L 23/544* | (2006.01) |
| *H01L 29/66* | (2006.01) |
| *H01L 29/04* | (2006.01) |
| *H01L 21/66* | (2006.01) |
| *H01L 29/40* | (2006.01) |
| *H01L 21/00* | (2006.01) |
| *H01L 29/78* | (2006.01) |
| *H01L 29/06* | (2006.01) |

(52) U.S. Cl.
CPC .......... *H01L 23/544* (2013.01); *H01L 29/045* (2013.01); *H01L 29/1608* (2013.01); *H01L 29/401* (2013.01); *H01L 29/66068* (2013.01); *H01L 29/0623* (2013.01); *H01L 29/7813* (2013.01); *H01L 2223/54453* (2013.01); *H01L 2924/0002* (2013.01)

(58) Field of Classification Search
CPC ......... H01L 29/66712; H01L 21/02447; H01L 21/025
See application file for complete search history.

(56) References Cited

U.S. PATENT DOCUMENTS

| | | | | |
|---|---|---|---|---|
| 7,241,694 B2 * | 7/2007 | Takeuchi | .............. | H01L 29/045 257/E21.066 |
| 7,595,241 B2 * | 9/2009 | Matocha | ............. | H01L 29/0634 257/328 |
| 7,691,711 B2 * | 4/2010 | Stum | ................... | H01L 29/1095 257/328 |
| 7,906,427 B2 * | 3/2011 | Fronheiser | .............. | H01L 22/12 438/622 |
| 9,018,699 B2 * | 4/2015 | Kiyosawa | ........... | H01L 21/0475 257/329 |
| 9,236,246 B2 * | 1/2016 | Hamano | ................. | C23C 16/46 |
| 2004/0201097 A1 * | 10/2004 | Ohsumi | .............. | H01L 23/3114 257/737 |
| 2006/0097267 A1 * | 5/2006 | Kumar | .............. | H01L 29/66068 257/77 |
| 2006/0132737 A1 * | 6/2006 | Magome | ............. | G03F 7/70341 355/53 |
| 2008/0102591 A1 * | 5/2008 | Nakamura | ........... | H01L 21/049 438/308 |
| 2015/0236012 A1 * | 8/2015 | Hino | ................... | H01L 27/0629 257/77 |
| 2015/0357251 A1 * | 12/2015 | Usami | ..................... | H01L 23/00 438/7 |
| 2016/0056241 A1 * | 2/2016 | Miyazaki | .............. | H01L 23/544 438/285 |

FOREIGN PATENT DOCUMENTS

| | | |
|---|---|---|
| JP | H10-038514 A | 2/1998 |
| JP | 2007-201499 A | 8/2007 |
| JP | 2007-273727 A | 10/2007 |
| JP | 2007-281157 A | 10/2007 |
| JP | 2008-053363 A | 3/2008 |
| JP | 2009-170558 A | 7/2009 |
| JP | 2011-100928 A | 5/2011 |
| JP | 2013-065650 A | 4/2013 |

OTHER PUBLICATIONS

Notice of Grounds of Rejection in counterpart Japanese Patent Application No. 2013-124657, dated Dec. 6, 2016.

* cited by examiner

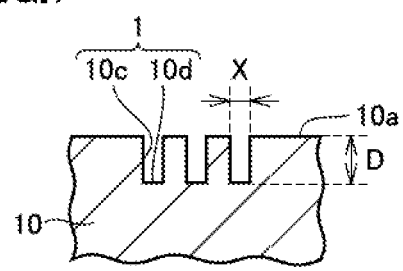
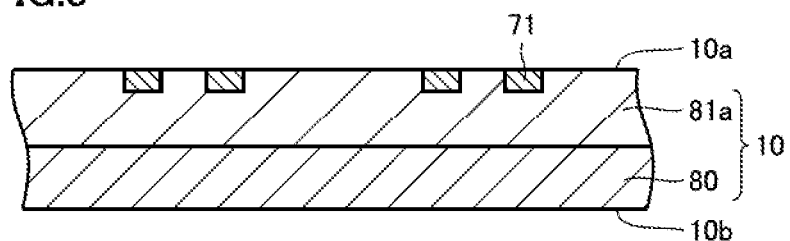

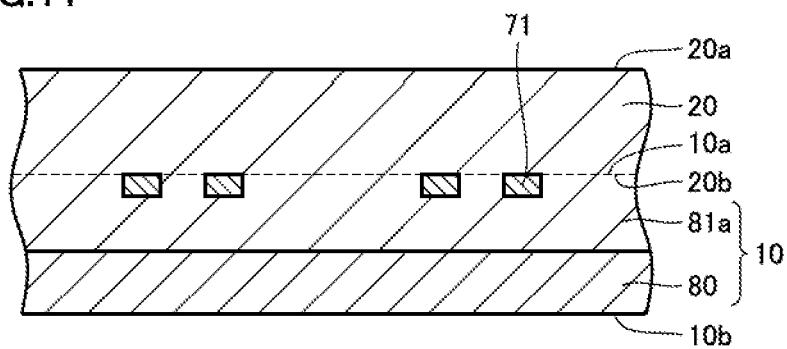
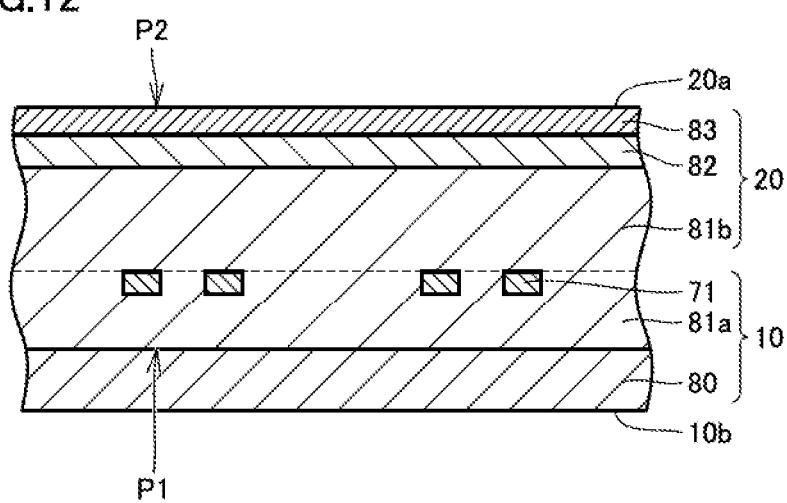

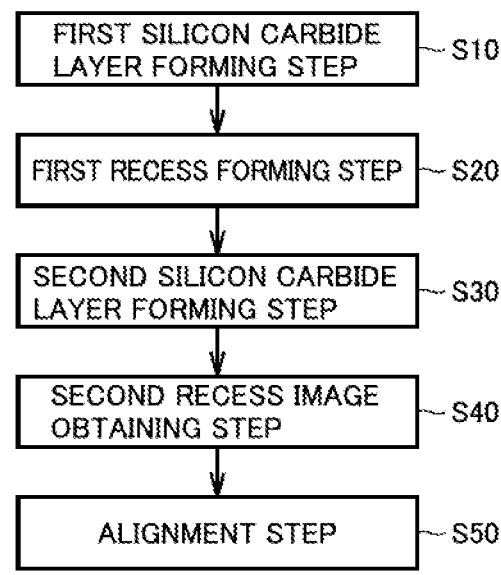
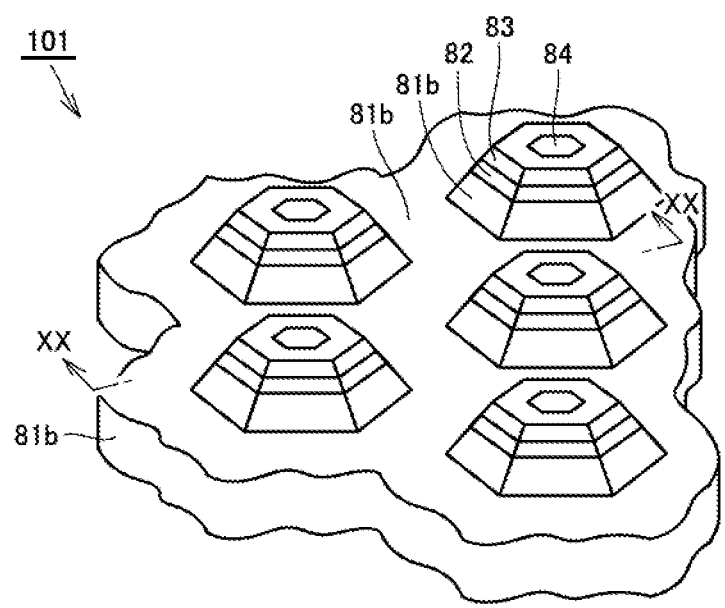

METHOD FOR MANUFACTURING SILICON CARBIDE SEMICONDUCTOR DEVICE

TECHNICAL FIELD

The present invention relates to a method for manufacturing a silicon carbide semiconductor device, more particularly, a method for manufacturing a silicon carbide semiconductor device including a step of performing alignment.

BACKGROUND ART

In recent years, in order to achieve high breakdown voltage, low loss, and utilization of semiconductor devices under a high temperature environment, silicon carbide has begun to be adopted as a material for a semiconductor device. Silicon carbide is a wide band gap semiconductor having a band gap larger than that of silicon, which has been conventionally widely used as a material for semiconductor devices. Hence, by adopting silicon carbide as a material for a semiconductor device, the semiconductor device can have a high breakdown voltage, reduced on resistance, and the like. Further, the semiconductor device thus adopting silicon carbide as its material has characteristics less deteriorated even under a high temperature environment than those of a semiconductor device adopting silicon as its material, advantageously.

For example, Japanese Patent Laying-Open No. 2011-100928 (Patent Document 1) describes a method of forming an alignment mark in a silicon carbide substrate having an off direction of <11-20>. According to the method described in Japanese Patent Laying-Open No. 2011-100928, a trench is used as the alignment mark. The trench has an opening having a shape symmetrical relative to the off direction, and has a polygonal shape having an apex at a portion located in the most downstream side of the oft direction. Accordingly, the silicon carbide substrate and the mask can be aligned with each other with high precision.

Moreover, Japanese Patent Laying-Open No. 2013-65650 (Patent Document 2) describes a method for manufacturing a silicon carbide semiconductor device, including a step of aligning an optical mask with an original position by correcting an influence resulting from deformation of an alignment mark if the shape of the alignment mark is deformed. Accordingly, even when an off substrate is used, a photolithographic optical mask can be aligned precisely.

Furthermore, Japanese Patent Laying-Open No. 2009-170558 (Patent Document 3) describes that a first trench for forming a device and a second trench used as an alignment mark are formed such that the first trench has a solid angle larger than the solid angle of the second trench. Accordingly, the growth rate of the bottom portion of the first trench can be larger than the growth rate of the bottom portion of the second trench, whereby when the main surface of the substrate is planarized, a recess is formed in the portion having had the second trench formed therein and the recess can be used as an alignment mark.

CITATION LIST

Patent Document

PTD 1: Japanese Patent Laying-Open No. 2011-1.00928
PTD 2: Japanese Patent Laying-Open No. 2013-65650
PTD 3: Japanese Patent Laying-Open No. 2009-170558

SUMMARY OF INVENTION

Technical Problem

However, even when a silicon carbide semiconductor device is manufactured using each of the methods described in Japanese Patent Laying-Open No. 2011-100928 and Japanese Patent Laying-Open No 2013-65650, sufficiently high alignment precision may not be attained.

Moreover, when the manufacturing method described in Japanese Patent Laying-Open No. 2009-170558 is used for a silicon carbide substrate having a main surface angled off relative to a {000} plane, the recess used as an alignment mark is formed asymmetrically, with the result that high alignment precision cannot be attained.

The present invention has been made in view of the above-mentioned problem, and has an object to provide a method for manufacturing a silicon carbide semiconductor device to allow for improved alignment precision.

Solution to Problem

A method for manufacturing a silicon carbide semiconductor device according to the present invention has the following steps. There is prepared a first silicon carbide layer having a first main surface and a second main surface opposite to the first main surface. A first recess is formed in the first main surface of the first silicon carbide layer, the first recess including a side portion continuously connected to the first main surface and a bottom portion continuously connected to the side portion. A second silicon carbide layer is formed in contact with the first main surface, the side portion, and the bottom portion, the second silicon carbide layer having a third main surface in contact with the first main surface and a fourth main surface opposite to the third main surface. An image of a second recess formed in the fourth main surface at a position facing the first recess is obtained. Alignment is performed based on the image of the second recess. The first main surface corresponds to a plane angled off relative to a {000} plane such that a normal line vector of the first main surface has at least one of components of <1-20> and <1-100>. A ratio obtained by dividing a depth of the first recess by a thickness of the second silicon carbide layer is more than 0.2.

Advantageous Effects of Invention

According to the present invention, there can be provided a method for manufacturing a silicon carbide semiconductor device to allow for improved alignment precision.

BRIEF DESCRIPTION OF DRAWINGS

FIG. 7 is a schematic cross sectional view schematically showing a structure of a region VII-VII of FIG. 6.

FIG. 8 is a schematic cross sectional view schematically showing a third step of the method for manufacturing the silicon carbide semiconductor device according to the embodiment of the present invention.

FIG. 11 is a schematic cross sectional view schematically showing a fourth step of the method for manufacturing the silicon carbide semiconductor device according to the embodiment of the present invention.

FIG. 12 is a schematic cross sectional view schematically showing a fifth step of the method for manufacturing the silicon carbide semiconductor device according to the embodiment of the present invention.

FIG. 21 is a flowchart schematically showing the method for manufacturing the silicon carbide semiconductor device according to the embodiment of the present invention.

FIG. 22 is a schematic perspective view schematically showing the structure of the silicon carbide layer.

DESCRIPTION OF EMBODIMENTS

Figure 1:
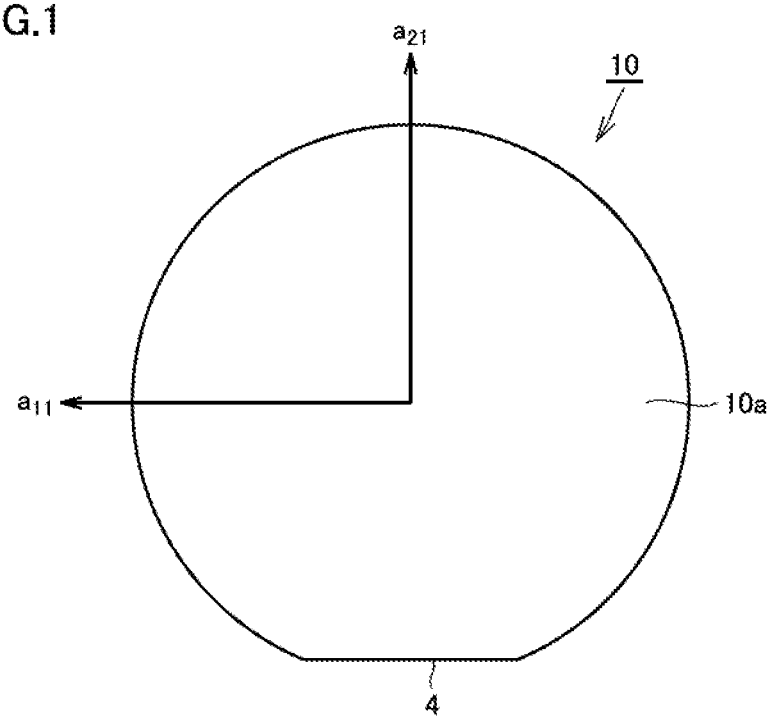
FIG. 1 is a schematic plan view schematically showing a first step of a method for manufacturing a silicon carbide semiconductor device according to one embodiment of the present invention.

The following describes an embodiment of the present invention based on figures. It should be noted that in the below-mentioned figures, the same or corresponding portions are given the same reference characters and are not described repeatedly. Regarding crystallographic indications in the present specification, an individual orientation is represented by [ ], a group orientation is represented by < >, and an individual plane is represented by ( ), and a group plane is represented by { }. In addition, a negative crystallographic index is normally expressed by putting "-" (bar) above a numeral, but is expressed by putting the negative sign before the numeral in the present specification.

First, the following describes an overview of embodiments of the present invention.

As a result of diligent study on a method of forming an alignment mark in a method for manufacturing a silicon carbide semiconductor device, the inventor has obtained the following knowledge and arrived at the present invention. As types of general alignment marks, there are the following two types: a recess type and a projection type. Moreover, as methods of recognizing an alignment mark, there are the following two methods' an LSA (Laser Step Alignment) method and an FIA (Field Image Alignment) method. The LSA method is an optical alignment method in which an alignment mark is irradiated with laser and reflected light of the laser is analyzed for the purpose of alignment. The FIA method is an image recognition method in which an edge of an image recognized by a camera is recognized for the purpose of alignment.

When forming a silicon carbide epitaxial layer on an angled-off main surface of a silicon carbide substrate, the silicon carbide epitaxial layer is grown asymmetrically with respect to the normal line of the main surface. When forming epitaxial layers on the recess type and projection type alignment marks, a difference in coverage between the epitaxial layers presumably causes a difference in alignment precision between the recess type and the projection type. Similarly, a difference in alignment precision also presumably lies between the LSA method and the FIA method.

The inventor prepared a silicon carbide substrate having a main surface provided with a recess type groove and a silicon carbide substrate having a main surface provided with a projection type protrusion, then formed silicon carbide epitaxial layers thereon, and then examined alignment precision using the recess and projection formed in the silicon carbide epitaxial layers. For the examination of the alignment precision, each of the LSA method and the FIA method was employed. As a result of the examination, it was found that with the LSA method, a position recognized for alignment is deviated from the actual position in each of the cases of the recess type and the projection type. This is presumably due to the following reason: because the alignment mark itself is deformed asymmetrically, a method employing reflection of light such as the LSA provides offset according to the asymmetrically deformed shape, with the result that the position recognized for alignment is deviated to one side. Next, with the FIA method, the device could not recognize the projection type alignment mark. On the other hand, the device could recognize the recess type alignment mark in some cases, and could not recognize it in other cases.

As a result of examining the alignment method employing the recess type alignment mark and the FIA method more in detail, the following knowledge was obtained. That is, it was found that when the recess formed in the main surface of the silicon carbide substrate has a small depth, the device cannot recognize the alignment mark; however, when the recess has a large depth, the device can recognize the alignment mark and alignment precision is very high. Moreover, it was found that the alignment precision is affected by not only the depth of the recess but also the thickness of the epitaxial layer formed on the recess. As a result of detailed examination, it was found that high alignment precision is attained when a ratio obtained by dividing the depth of the recess by the thickness of the epitaxial layer formed on the recess is not less than 0.2.

(1) A method for manufacturing a silicon carbide semiconductor device according to an embodiment includes the following steps. There is prepared a first silicon carbide layer 10 having a first main surface 10a and a second main surface 10b opposite to first main surface 10a. A first recess 1 is formed in first main surface 10a of first silicon carbide layer 10, first recess 1 including a side portion 10c continuously connected to first main surface 10a and a bottom portion 10d continuously connected to side portion 10c. A second silicon carbide layer 20 is formed in contact with first main surface 10a, side portion 10c, and bottom portion 10d, second silicon carbide layer 20 having a third main surface 20b in contact with first main surface 10a and a fourth main surface 20a opposite to third main surface 20b. An image of a second recess 2 formed in fourth main surface 20a at a position facing first recess 1 is obtained. Alignment is performed based on the image of second recess 2. The first main surface corresponds to a plane angled off relative to a {0001} plane such that a normal line vector z of first main surface 10a has at least one of components of <11-20> and <1-100>. A ratio obtained by dividing a depth D of first recess 1 by a thickness T of second silicon carbide layer 20 is more than 0.2.

According to the method for manufacturing the silicon carbide semiconductor device according to the embodiment, the ratio obtained by dividing depth D of first recess 1 by thickness T of second silicon carbide layer 20 is more than 0.2. Accordingly, there can be provided a method for manufacturing a silicon carbide semiconductor device to allow for improved alignment precision.

(2) Preferably in the method for manufacturing the silicon carbide semiconductor device according to the embodiment, a size X1 of an opening 1a of first recess 1 in an in-plane off direction is less than a size Y1 of opening 1a of first recess 1 in a direction perpendicular to the in-plane off direction. Accordingly, there can be provided a method for manufacturing a silicon carbide semiconductor device to allow for effectively improved alignment precision. Here, the off direction refers to a direction in which normal line vector z of first main surface 10a is inclined relative to a [0001] direction (i.e., c axis). The in-plane off direction refers to a direction obtained by projecting the off direction on first main surface 10a. Specific examples of the off direction and the in-plane off direction will be described later.

(3) Preferably in the method for manufacturing the silicon carbide semiconductor device according to the embodiment, size X1 of opening 1a of first recess 1 in the in-plane off direction is not less than 2 μm and not more than 15 μm. When size X1 of opening 1a is not less than 2 μm, the first recess can be effectively suppressed from being filled. Moreover, when size X1 of opening 1a is not more than 15 μm, opening end portion 1a1 of opening 1a facing opposite to the in-plane off direction can be suppressed from being reduced in angle.

(4) Preferably in the method for manufacturing the silicon carbide semiconductor device according to the embodiment, second recess 2 is an alignment mark used in an exposure process. Accordingly, in the exposure process, high alignment precision can be realized.

(5) Preferably in the method for manufacturing the silicon carbide semiconductor device according to the embodiment, thickness T of second silicon carbide layer 20 is not less than 0.5 μm and not more than 5 μm. When thickness T of second silicon carbide layer 20 is not less than 0.5 μm, an effect of increase of on resistance can be suppressed from being strong. When thickness T of second silicon carbide layer 20 is not more than 5 μm, first recess 1 can be suppressed effectively from being filled. Moreover, when a relaxation region 71 is formed in first silicon carbide layer 10, an electric field relaxation effect of relaxation region 71 can be maintained to be high.

(6) Preferably in the method for manufacturing the silicon carbide semiconductor device according to the embodiment in the step of forming first recess 1, first recess 1 is formed on a dicing line 3 of first main surface 10a. By forming first recess 1 on the dicing line, alignment precision can be increased without decreasing an area in which a semiconductor element is formed.

(7) Preferably, the method for manufacturing the silicon carbide semiconductor device according to the embodiment further includes a step of forming a first impurity region 71 in first silicon carbide layer 10 after the step of forming first silicon carbide layer 10. Accordingly, the silicon carbide semiconductor device having first impurity region. 71 can be obtained.

(8) Preferably, the method for manufacturing the silicon carbide semiconductor device according to the embodiment further includes a step of forming at least one of a second impurity region 84 and an electrode 94 after the step of performing the alignment based on the image of the second recess. Accordingly, alignment precision can be improved for at least one of the second impurity region and electrode 94.

Next, an embodiment of the present invention will be described more in detail.

With reference to FIG. 1 to FIG. 21, the following describes a method for manufacturing a MOSFET 100 serving as a silicon carbide semiconductor device according to the present embodiment.

First, a first silicon carbide layer forming step (S10 FIG. 21) is performed. Specifically, with reference to FIG. 1 and FIG. 2, a silicon carbide single crystal substrate 80 is prepared by slicing an ingot made of, for example, hexagonal silicon carbide having polytype 4H. Next, by epitaxial growth on silicon carbide single crystal substrate 80, a first epitaxial layer 81a made of silicon carbide is formed. This epitaxial growth can be performed by a CVD (Chemical Vapor Deposition) method employing a mixed gas of silane ($SiH_4$) and propane ($C_3H_8$) as a source material gas and employing hydrogen gas ($H_2$) as a carrier gas, for example. In doing so, it is preferable to introduce nitrogen (N) or phosphorus (P) as an impurity, for example. As described above, silicon carbide epitaxial substrate 10 serving as a first silicon carbide layer is prepared. Silicon carbide epitaxial substrate 10 has n type (first conductivity type).

Silicon carbide epitaxial substrate 10 has a first main surface 10a and a second main surface 10b opposite to first main surface 10a. Silicon carbide epitaxial substrate 10 includes: silicon carbide single crystal substrate 80; and a first epitaxial layer 81a constituted of a silicon carbide epitaxial layer formed on silicon carbide single crystal substrate 80, for example. Silicon carbide epitaxial substrate 10 may be provided with an orientation flat portion 4. When a direction a11 in which orientation flat portion 4 extends is a <11-20> direction, a direction a21 perpendicular to direction a11 is a <1-100> direction. Moreover, direction a11 in which orientation flat portion 4 extends is a <1-100> direction, a direction a21 perpendicular to direction a11 may be a <11-20> direction, for example.

Figure 2:
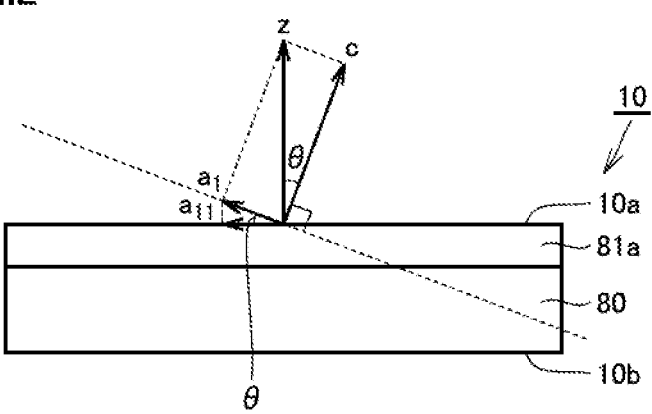
FIG. 2 is a schematic cross sectional view schematically showing the first step of the method for manufacturing the silicon carbide semiconductor device according to the embodiment of the present invention.

With reference to FIG. 2, first main surface 10a corresponds to a plane angled off in of direction a1 by an off angle θ relative to a {0001} plane (plane indicated by a broken line), for example. Off angle θ is preferably an angle of not more than 8°, such as 4° or 8°. Specifically, the first main surface corresponds to a plane angled off relative to the {0001} plane such that a normal line vector z of first main surface 10a has at least one of components of <11-20> and <1-100>. Preferably, first main surface 10a corresponds to a plane angled off relative to the {1000} plane such that normal line vector z of first main surface 10a has a component of <1-20>. In FIG. 2, a direction c is a [0001] direction (i.e., the c axis of the hexagonal silicon carbide), and direction a1 is the <11-20> direction, for example. The off direction is a direction in which normal line vector z of first main surface 10a is inclined relative to the [0001] direction. In the case of FIG. 2, the off direction is the a1 direction (i.e., the <11-20> direction). In FIG. 2, first main surface 10a corresponds to a plane obtained by inclining the (0001) plane off relative to the a1 direction. The in-plane off direction represents a direction obtained by projecting the off direction on first main surface 10a. In the case of FIG. 2, the in-plane off direction is the a11 direction.

Next, a first recess forming step (S20: FIG. 21) is performed. Specifically, with reference to FIG. 3, a first recess 1 is formed to have an opening in first main surface 10a of silicon carbide epitaxial substrate 10, and includes: a side portion 10c continuously connected to first main surface 10a; and a bottom portion 10d continuously connected to side portion 10c. First recess 1 has a depth. D of, for example, about not less than 0.5 μm and not more than 2 μm, preferably, about not less than 0.7 μm and not more than 1.5 μm, and further preferably, about not less than 0.7 μm and not more than 1.0 μm. Moreover, size X1 of opening 1a of first recess 1 in in-plane off direction a11 is, for example, about not less than 2 μm and not more than 15 μn, and preferably about not less than 4 μm and not more than 8 μm. When size X1 is not less than 2 μm, the recess can be suppressed from being filled, whereas when size X1 is not less than 4 μm, the recess is substantially not filled. Moreover, when size X1 is not more than 15 μm, an opening end portion 1a1 of first recess 1 facing opposite to the a11 direction can be suppressed from being reduced in angle, whereas when size X1 is not more than 8 μm, opening end portion 1a1 facing opposite to the a11 direction can be substantially securely suppressed from being reduced in angle.

Figure 4:
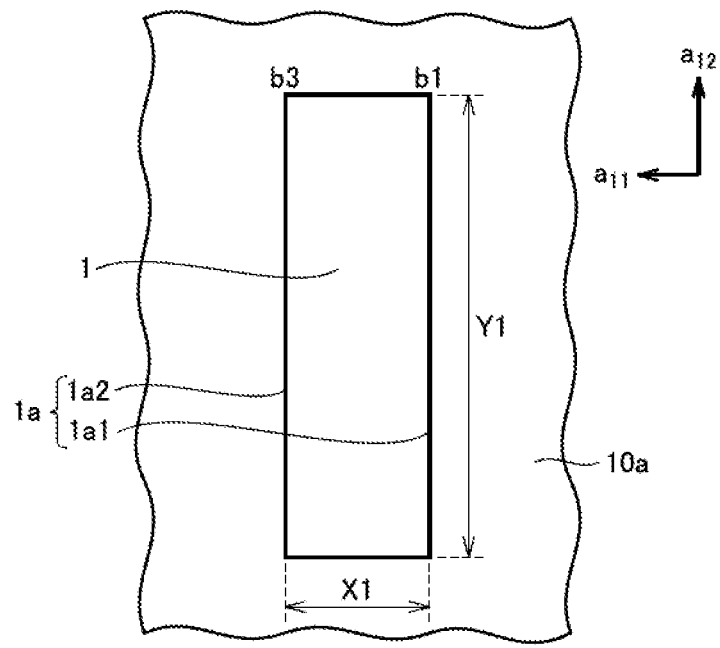
FIG. 4 is a schematic plan view schematically showing the structure of the first recess.

Preferably, with reference to FIG. 4, when viewed in a plan view (field of view seen in the normal direction of first main surface 10a), size X1 of opening 1a of first recess 1 in in-plane off direction a11 is smaller than size Y1 of opening 1a of first recess 1 in direction a12 perpendicular to in-plane off direction a11. Size X1 is 6 μm and size Y1 is 80 μm, for example. Size X1 may be not more than 0.1 time as large as size Y1.

Figure 5:
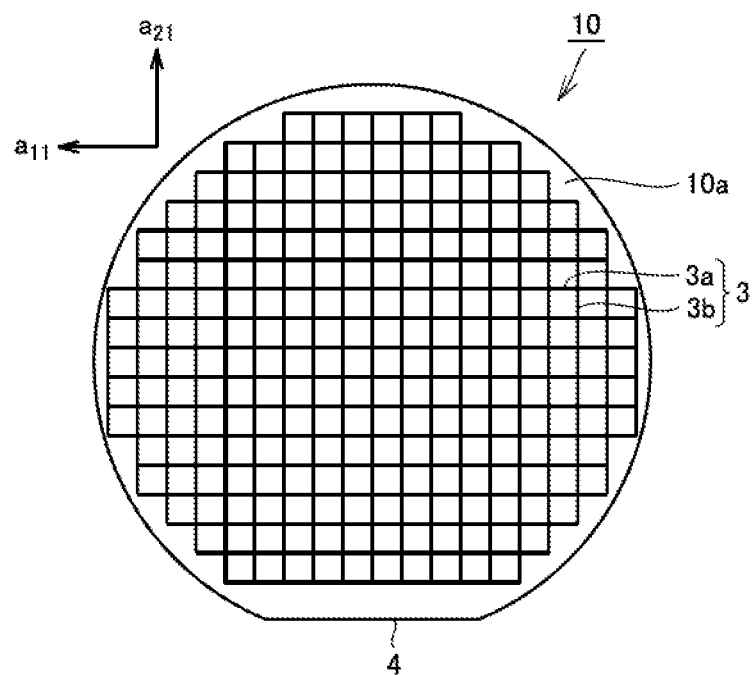
FIG. 5 is a schematic cross sectional view schematically showing a second step of the method for manufacturing the silicon carbide semiconductor device according to the embodiment of the present invention.

With reference to FIG. 5, first main surface 10a of silicon carbide epitaxial substrate 10 may be provided with a plurality of dicing lines 3 in the a11 direction parallel to the direction in which orientation flat portion 4 extends and the a12 direction perpendicular to the a11 direction. A dicing line 3 represents a cutting position for cutting silicon carbide epitaxial substrate 10 having semiconductor elements formed thereon. In other words, dicing line 3 represents a position to be cut in a dicing step. Dicing line 3 may be a groove.

Figure 6:
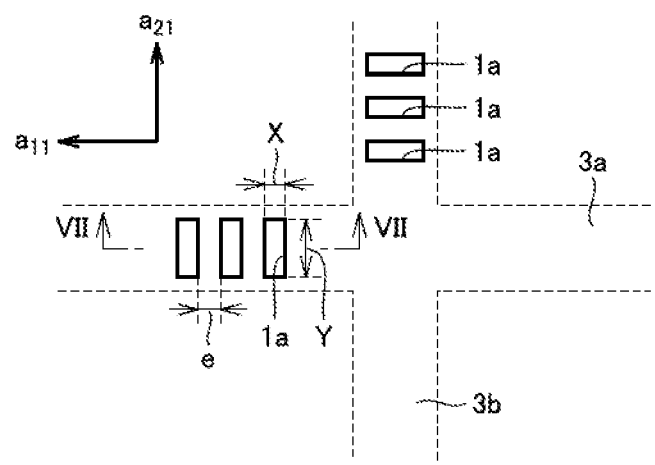
FIG. 6 is a schematic plan view schematically showing the structure of the first recess formed on a dicing line.

With reference to FIG. 6 and FIG. 7, in the step of forming the first recess, first recess 1 is preferably formed on dicing line 3 of first main surface 10a. First recess 1 is preferably formed such that the longitudinal direction of opening 1a of first recess 1 (more preferably, perpendicularly) crosses the direction in which dicing line 3 extends. As shown in FIG. 6, a plurality of first recesses 1 may be provided in the direction in which the dicing line extends. A space e between two adjacent first recesses 1 may be larger or smaller than size X1 of first recess 1. Space e of two adjacent first recesses 1 is about not less than 4 μm and not more than 8 μm, for example. More preferably, a plurality of first recesses 1 are formed on each of a dicing line 3a extending in a direction parallel to the direction in which orientation flat portion 4 extends and a dicing line 3b extending in a direction perpendicular to dicing line 3b.

With reference to FIG. 8, a relaxation region 71 (first impurity region) having p type (second conductivity type) is formed in contact with a portion of first main surface 10a of first epitaxial layer 81a. Specifically, acceptor ions (impurity ions for providing the second conductivity type) are implanted into first main surface 10a of first epitaxial layer 81a using an implanting mask (not shown). It should be noted that relaxation region 71 may be formed after forming first recess 1 or may be formed before forming first recess 1.

Figure 9:
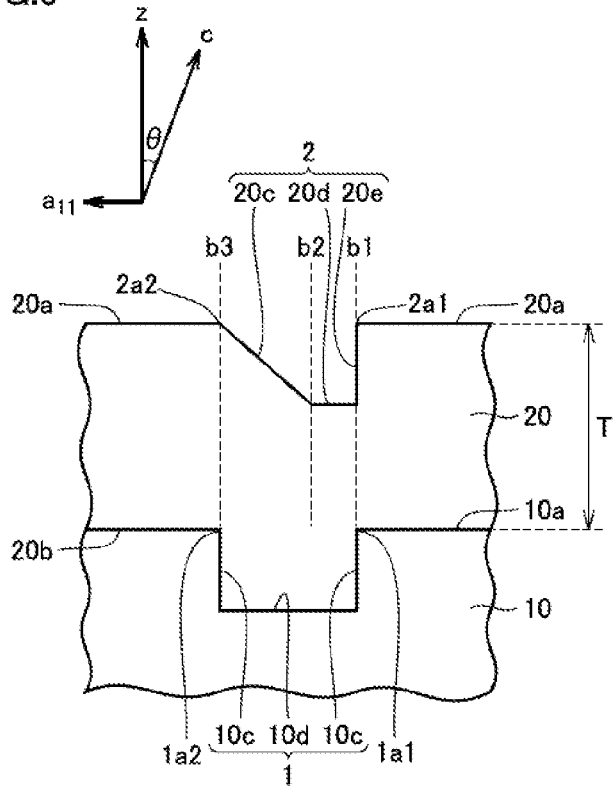
FIG. 9 is a schematic cross sectional view schematically showing a structure of a second recess.
Figure 10:
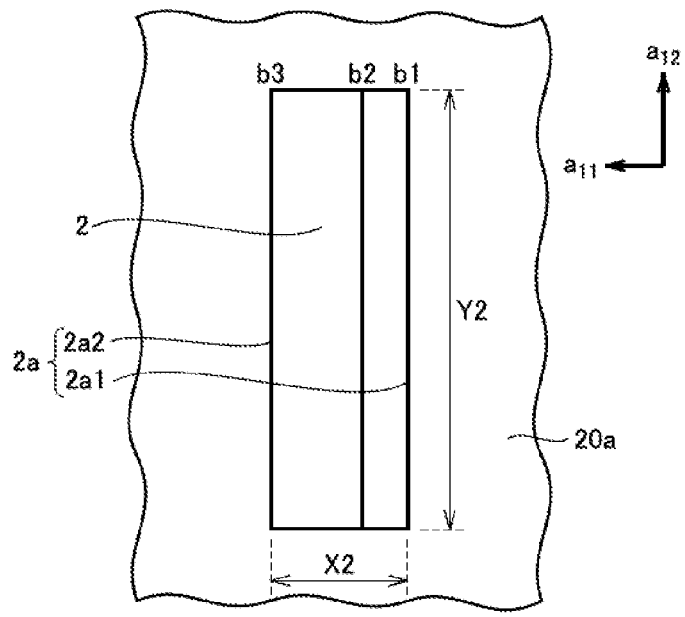
FIG. 10 is a schematic plan view schematically showing the structure of the second recess.

Next, a second silicon carbide layer forming step (S30: FIG. 21) is performed. With reference to FIG. 9 to FIG. 11, after relaxation region 71 is formed in first epitaxial layer 81a, a second silicon carbide layer 20 having n type conductivity and made of silicon carbide is formed in contact with first main surface 10a of silicon carbide epitaxial substrate 10. Second silicon carbide layer 20 has a third main surface 20b and a fourth main surface 20a opposite to third main surface 20b. Second silicon carbide layer 20 is in contact with first main surface 10a, side portion 10c of first recess 1, and bottom portion 10d of first recess 1. Third main surface 20b of second silicon carbide layer 20 is in contact with first main surface 10a. Second silicon carbide layer 20 is formed to fill first recess 1. Second silicon carbide layer 20 has a thickness T of, for example, about not less than 0.5 μm and not more than 5 μm, and preferably, about not less than 1.5 μm and not more than 3 μm. A ratio obtained by dividing depth D of first recess 1 by thickness T of second silicon carbide layer 20 is more than 0.2. The ratio is preferably not less than 0.23, is more preferably not less than 0.27, and is further preferably not less than 0.33.

As shown in FIG. 9, a second recess 2 having an opening in fourth main surface 20a is formed in fourth main surface 20a of second silicon carbide layer 20 at a position facing first recess 1. Second recess 2 includes: a first side portion 20c and a second side portion 20e each continuously connected to fourth main surface 20a; and a bottom portion 20d connecting first side portion 20c and second side portion 20e to each other. Second recess 2 can be used as an alignment mark. First side portion 20c of second recess 2 is formed to correspond to a plane perpendicular to the c axis, for example.

With reference to FIG. 9, when viewed in a direction perpendicular to both in-plane off direction a11 and normal line vector z of first main surface 10a, opening end portion 2a1 of second recess 2 facing opposite to in-plane off direction a11 in the direction parallel to first main surface 10a is formed at a position b1 substantially corresponding to opening end portion 1a1 of first recess 1. Meanwhile, opening end portion 2a2 of second recess 2 facing in-plane off direction a11 in the direction parallel to first main surface 10a is formed at a position b3 substantially corresponding to opening end portion 1a2 of first recess 1. Hence, the width of opening 2a of second recess 2 in in-plane off direction a11 (i.e., distance between position b1 and position b3) is substantially the same as the width of opening 1a of first recess 1 in the in-plane off direction. However, the width of bottom portion 20d of second recess 2 in in-plane off direction a11 (i.e., distance between position b1 and position b2) is less than the width of bottom portion 10d of first recess 1 in in-plane off direction a11 (i.e., distance between position b1 and position b3).

With reference to FIG. 10, size X2 of opening 2a of second recess 2 in in-plane off direction a11 is less than size Y2 of opening 2a of second recess 2 in direction a12 perpendicular to in-plane off direction a11. Moreover, size Y1 of opening 1a of first recess 1 in direction a12 perpendicular to in-plane off direction a11 is substantially the same as size Y2 of opening 2a of second recess 2 in direction a12 perpendicular to in-plane off direction a11. As described above, position b1 of opening end portion 2a1 of second recess 2 facing opposite to in-plane off direction a11 substantially corresponds to position b1 of opening end portion 1a1 of first recess 1 facing opposite to in-plane off direction a11, whereby alignment precision can be high by performing alignment using opening end portion 2a1 of second recess 2. Further, when size Y1 of opening 1a of first recess 1 in direction a12 perpendicular to the in-plane off direction is increased to be more than size X1 of opening 1a of first recess 1 in in-plane off direction a11, size Y2 of opening 2a of second recess 2 in direction a12 perpendicular to the in-plane off direction can be increased, thereby effectively improving alignment precision.

With reference to FIG. 11, because second silicon carbide layer 20 is formed in contact with first main surface 10a of silicon carbide epitaxial substrate 10, relaxation region 71 is buried in first epitaxial layer 81a and second silicon carbide layer 20 constituted of first epitaxial layer 81a and second silicon carbide layer 20. Second silicon carbide layer 20 may be formed by the same method as the method of forming first epitaxial layer 81a.

Figure 13:
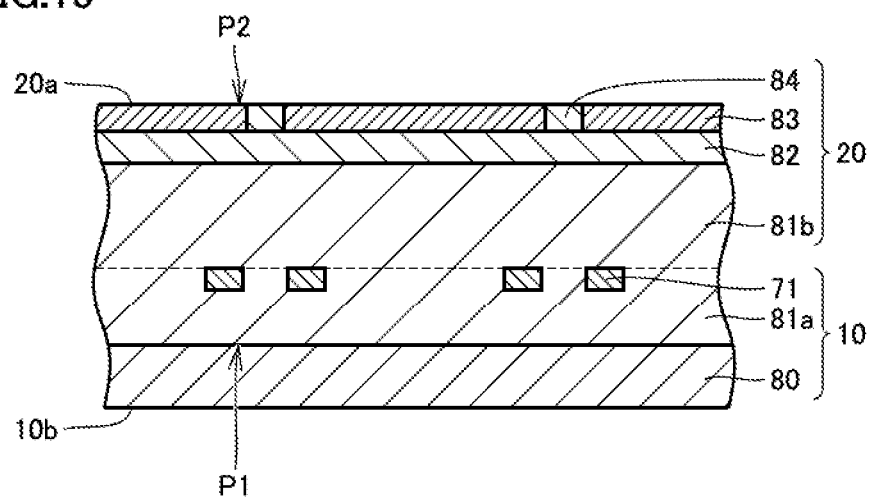
FIG. 13 is a schematic cross sectional view schematically showing a sixth step of the method for manufacturing the silicon carbide semiconductor device according to the embodiment of the present invention.

As shown in FIG. 12, a p base layer 82 and an n region 83 are formed in second silicon carbide layer 20. Moreover, as shown in FIG. 13, a p contact region 84 is formed on p base layer 82. They can be formed by means of, for example, ion implantations into the second silicon carbide layer (FIG. 11). In the ion implantations for forming p base layer 82 and p contact region 84, ions of an impurity for providing p type such as aluminum (Al) are implanted. Meanwhile, in the ion implantation for forming n region 83, ions of an impurity for providing n type conductivity such as phosphorus (P) are implanted, for example. It should be noted that instead of the ion implantations, epitaxial growth involving addition of impurities may be employed.

Before forming p contact region 84, a second recess image obtaining step (S40: FIG. 21) and an alignment step (S50: FIG. 21) may be performed. Specifically, an image of second recess 2 formed in fourth main surface 20a of second silicon carbide layer 20 at the position facing first recess 1 is obtained. The image of second recess 2 may be obtained by, for example, a camera and an edge of second recess 2 may be recognized. The edge of second recess 2 is, for example, opening end portion 2a1 of opening 2a of second recess 2 facing opposite to the in-plane off direction (see FIG. 10). Next, alignment is performed based on the image of second recess 2. Second recess 2 is an alignment mark used in an exposure process, for example. Specifically, the position of silicon carbide epitaxial substrate 10 having second silicon carbide layer 20 formed thereon is adjusted such that a mask layer formed of, for example, a resist is formed on fourth main surface 20a and the mask layer above a region in which p contact region 84 is to be formed is exposed. Next, the mask layer is subjected to exposure and development, thereby removing a portion of the mask layer above the region in which p contact region 84 is to be formed. Next, ions are implanted into second silicon carbide layer 20 using the remaining mask layer, thereby forming p contact region 84. As described above, p contact region 84 (second impurity region) is formed after alignment is performed based on the image of second recess 2. In the manner described above, the relative position of p contact region 84 to relaxation region 71 in the in-plane direction of fourth main surface 20a may be adjusted.

Next, heat treatment is performed to activate the impurities. This heat treatment is preferably performed at a temperature of not less than 1500° C. and not more than 1900° C., such as a temperature of approximately 1700° C. The heat treatment is performed for approximately 30 minutes, for example. The atmosphere of the heat treatment is preferably an inert gas atmosphere, such as Ar atmosphere.

Figure 14:
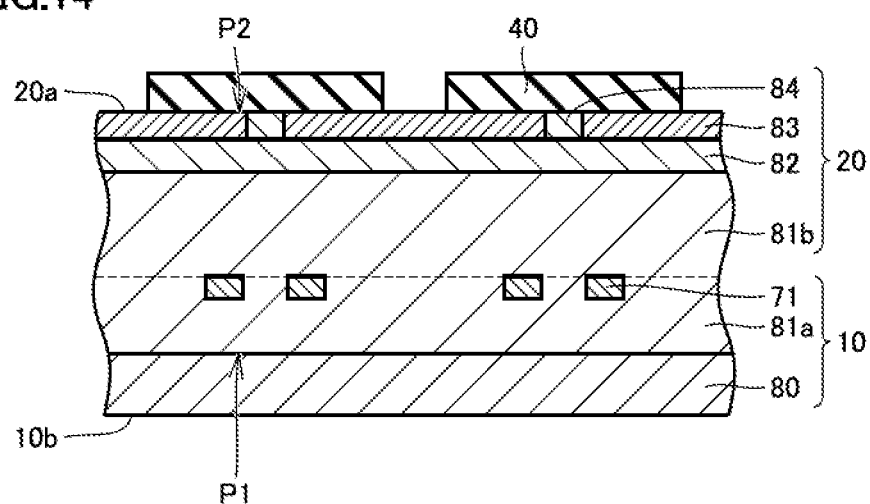
FIG. 14 is a schematic cross sectional view schematically showing a seventh step of the method for manufacturing the silicon carbide semiconductor device according to the embodiment of the present invention.

As shown in FIG. 14, a mask layer 40 having an opening is formed on fourth main surface 20a constituted of n region 83 and p contact region 84. As mask layer 40, a silicon oxide film or the like can be used, for example. The opening is formed corresponding to the position of a trench TR (see FIG. 20). Based on the image of second recess 2 formed in second silicon carbide layer 20, mask layer 40 may be aligned and formed such that a position corresponding to the opening is exposed.

Figure 15:
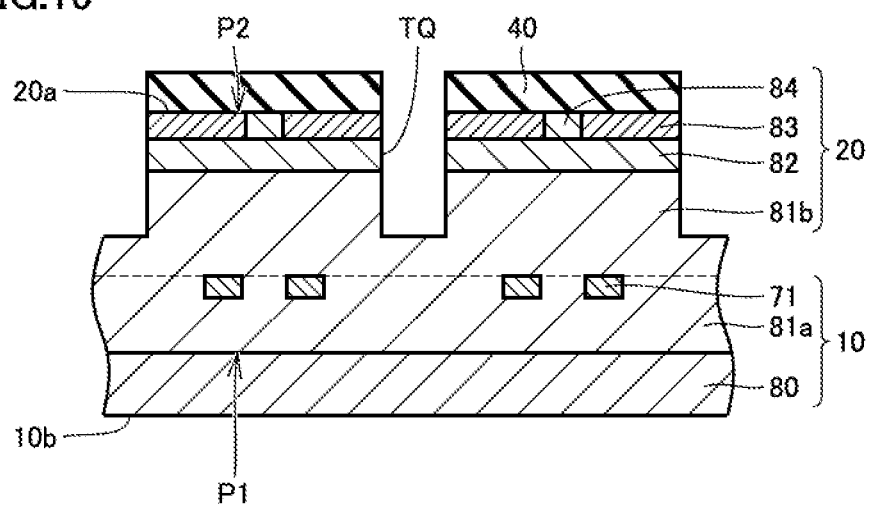
FIG. 15 is a schematic cross sectional view schematically showing an eighth step of the method for manufacturing the silicon carbide semiconductor device according to the embodiment of the present invention.

As shown in FIG. 15, in the opening of mask layer 40, n region 83, p base layer 82, and a portion of second epitaxial layer 81b are removed by etching. An exemplary, usable etching method is reactive ion etching (RIE), in particular, inductively coupled plasma (ICP) RIE. Specifically, for example, TCP-RIE can be used which employs $SF_6$ or a mixed gas of $SF_6$ and $O_2$ as a reactive gas. With such etching, in the region in which trench TR (see FIG. 20) is to be formed, a recess TQ is formed to have a side wall substantially perpendicular to upper surface P2 (i.e., fourth main surface 20a).

Next, thermal etching is performed in recess TQ. For example, the thermal etching can be performed by heating in an atmosphere including a reactive gas having at least one or more types of halogen atom. The at least one or more types of halogen atom include at least one of chlorine (Cl) atom and fluorine (F) atom. This atmosphere is $Cl_2$, $BCL_3$, $SF_6$, or $CF_4$, for example. For example, the thermal etching is performed using a mixed gas of chlorine gas and oxygen gas as a reactive gas, at a heat treatment temperature of, for example, not less than 700° C. and not more than 1000° C.

It should be noted that the reactive gas may contain a carrier gas in addition to the chlorine gas and the oxygen gas. An exemplary, usable carrier gas is nitrogen ($N_2$) gas, argon gas, helium gas, or the like. When the heat treatment temperature is set at not less than 700° C. and not more than 1000° C. as described above, a rate of etching silicon carbide is approximately, for example, 70 μm/hour. In addition, in this case, mask layer 40, which is formed of silicon oxide and therefore has a very large selection ratio relative to silicon carbide, is not substantially etched during the etching of silicon carbide.

Figure 16:
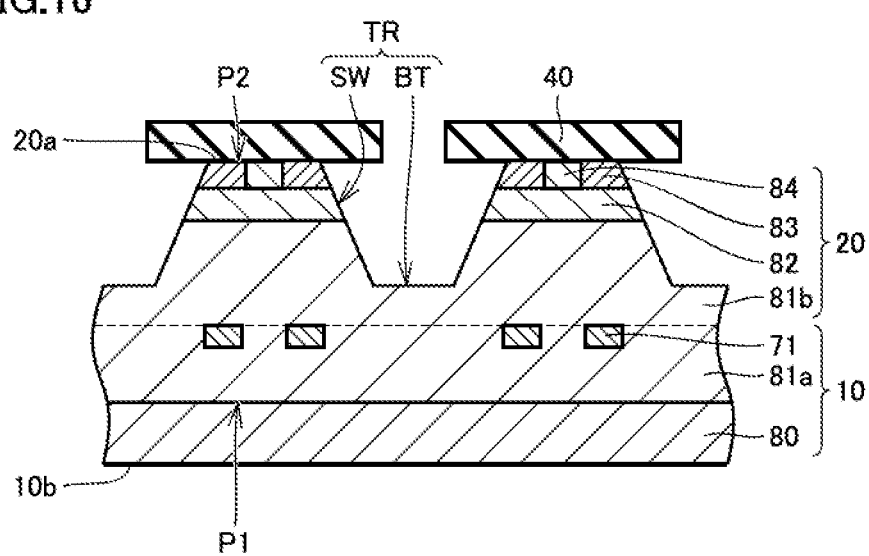
FIG. 16 is a schematic cross sectional view schematically showing a ninth step of the method for manufacturing the silicon carbide semiconductor device according to the embodiment of the present invention.

As shown in FIG. 16, by the thermal etching, trench TR is formed in upper surface P2 of silicon carbide layer 101. Trench TR includes: a side wall surface SW extending to second epitaxial layer 81b through n region 83 and p base layer 82; and a bottom surface BT located on second epitaxial layer 81b. Each of side wall surface SW and bottom surface BT is separated from relaxation region 71. Next, mask layer 40 is removed by means of an appropriate method such as etching (FIG. 22).

Figure 17:
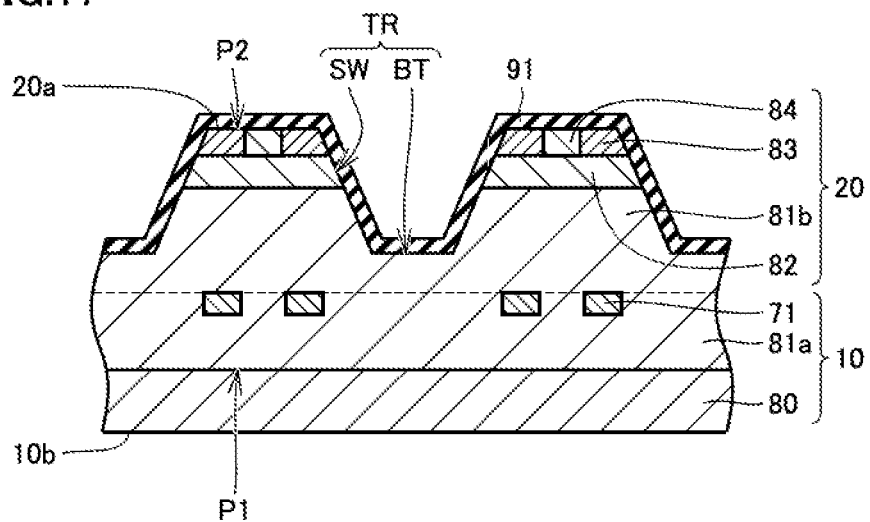
FIG. 17 is a schematic cross sectional view schematically showing a tenth step of the method for manufacturing the silicon carbide semiconductor device according to the embodiment of the present invention.

As shown in FIG. 17, gate oxide film 91 is formed to cover each of side wall surface SW and bottom surface BT of trench TR. Gate oxide film 91 can be formed by means of, for example, thermal oxidation. Thereafter, NO annealing may be performed using nitrogen monoxide (NO) gas as an atmospheric gas. A temperature profile has such a condition that the temperature is not less than 1100° C. and not more than 1300° C. and holding time is approximately 1 hour, for example. Accordingly, nitrogen atoms are introduced in an interface region between gate oxide film 91 and p base layer 82. As a result, formation of interface states in the interface region is suppressed, thereby achieving improved channel mobility. It should be noted that a gas other than the NO gas can be employed as the atmospheric gas as long as the nitrogen atoms can be thus introduced. After this NO annealing, Ar annealing may be further performed using argon (Ar) as an atmospheric gas. The Ar annealing is preferably performed at a heating temperature higher than the heating temperature in the above-described NO annealing and lower than the melting point of gate oxide film 91. This heating temperature is held for approximately 1 hour, for example. Accordingly formation of interface states in the interface region between gate oxide film 91 and p base layer 82 is further suppressed. It should be noted that instead of the Ar gas, an inert gas such as nitrogen gas can be employed as the atmospheric gas.

Figure 18:
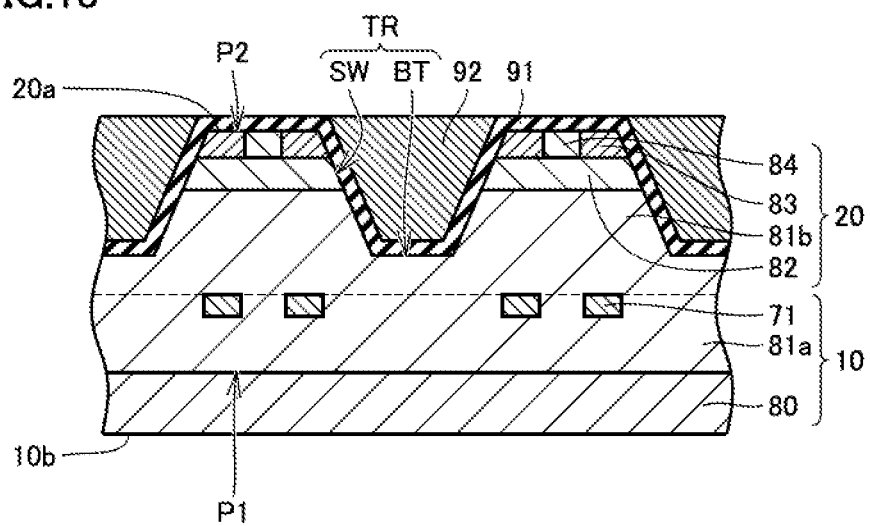
FIG. 18 is a schematic cross sectional view schematically showing an eleventh step of the method for manufacturing the silicon carbide semiconductor device according to the embodiment of the present invention.

As shown in FIG. 18, gate electrode 92 is formed on gate oxide film 91. Specifically, gate electrode 92 is formed on gate oxide film 91 so as to fill the region within trench TR with gate oxide film 91 interposed therebetween. A method for forming gate electrode 92 can be performed by, for example, forming a film of conductor or doped polysilicon and performing CMP (Chemical Mechanical Polishing).

Figure 19:
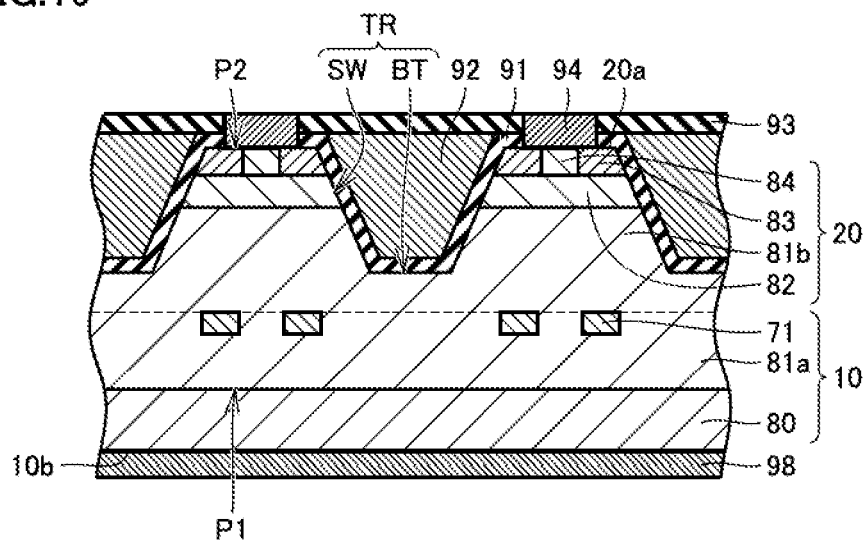
FIG. 19 is a schematic cross sectional view schematically showing a twelfth step of the method for manufacturing the silicon carbide semiconductor device according to the embodiment of the present invention.

With reference to FIG. 19, an interlayer insulating film 93 is formed on gate electrode 92 and gate oxide film 91 so as to cover the exposed surface of gate electrode 92. Etching is performed to form an opening in interlayer insulating film 93 and gate oxide film 91. Through the opening, each of n region 83 and p contact region 84 is exposed on upper surface P2. The opening may be formed after performing alignment based on the image of second recess 2 formed in second silicon carbide layer 20 and then performing the exposure and development processes. Next, on upper surface P2, a source electrode 94 is formed in contact with each of n region 83 and n contact region 84. A drain electrode 98 is formed on lower surface P1 constituted of first epitaxial layer 81a with silicon carbide single crystal substrate 80 being interposed therebetween.

Figure 20:
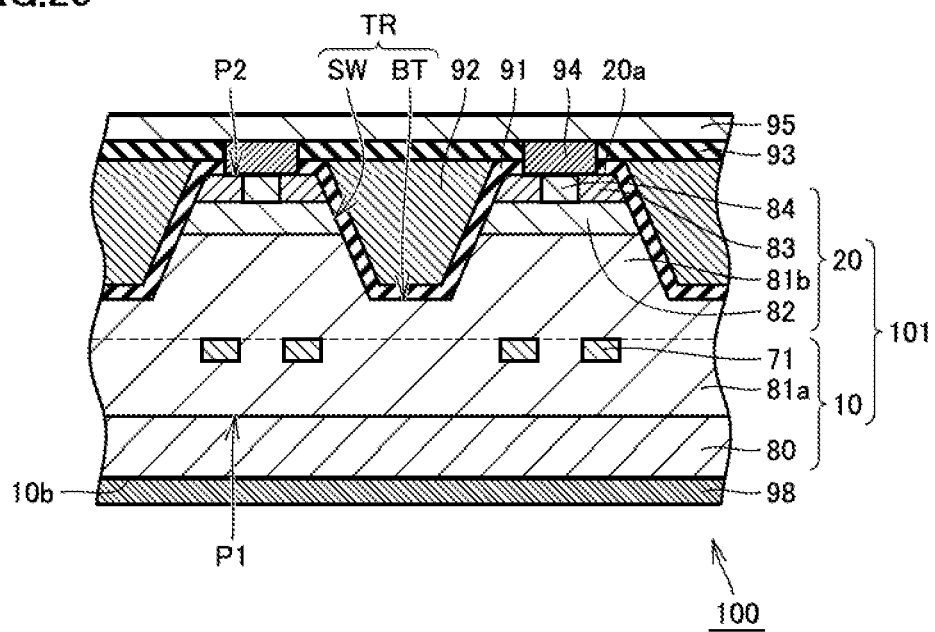
FIG. 20 is a schematic cross sectional view schematically showing the structure of the silicon carbide semiconductor device according to the embodiment of the present invention.

With reference to FIG. 20, a source interconnection layer 95 is formed. In this way, MOSFET 100 is completed which serves as a silicon carbide semiconductor device and which includes silicon carbide layer 101, gate oxide film 91, gate electrode 92, interlayer insulating film 93, source electrode 94, source interconnection layer 95, and drain electrode 98. Silicon carbide layer 101 has a hexagonal crystal structure of polytype 4H. Silicon carbide layer 101 includes first silicon carbide layer 10 and second silicon carbide layer 20. First silicon carbide layer 10 includes silicon carbide single crystal substrate 80, first epitaxial layer 81a, and relaxation region 71. Second silicon carbide layer 20 includes second epitaxial layer 81b, p base layer 82, n region 83, and p contact region 84S.

Each of first epitaxial layer 81a and second epitaxial layer 81b has n type conductivity. Each of first epitaxial layer 81a and second epitaxial layer 81b preferably has an impurity concentration lower than the impurity concentration of silicon carbide single crystal substrate 80. Each of first epitaxial layer 81a and second epitaxial layer 81b preferably has a donor concentration of not less than $1 \times 10^{15}$ cm$^{-3}$ and not more than $5 \times 10^{16}$ cm$^{-3}$, such as $8 \times 10^{15}$ cm$^{-3}$.

P base layer 82 has p type. P base layer 82 is provided on second epitaxial layer 81b. P base layer 82 has an acceptor concentration of, for example, $1 \times 10^{18}$ cm$^{-3}$. N region 83 has n type conductivity. N region 83 is provided on p base layer 82 so as to be separated from second epitaxial layer 81b by p base layer 82. N region 83 and p contact region 84 constitute upper surface P2 of silicon carbide layer 101. P contact region 84 has p type conductivity. P contact region 84 is connected to p base layer 82.

Trench TR is provided in upper surface P2 of silicon carbide layer 101. Trench TR has a side wall surface SW and a bottom surface BT. Side wall surface SW extends to second epitaxial layer 81b through n region 83 and p base layer 82. Side wall surface SW includes a channel surface of MOSFET 100 on p base layer 82. Side wall surface SW is inclined relative to upper surface P2 of silicon carbide layer 101, whereby trench TR is expanded toward the opening in a tapered manner. Side wall surface SW preferably has a plane orientation, inclined by not less than 50° and not more than 65° relative to the {0001} plane, and more preferably has a plane orientation inclined by not less than 50° and not more than 65° relative to the (000-1) plane.

Bottom surface BT is located on second epitaxial layer 81b. In the present embodiment, bottom surface BT has a flat shape substantially parallel to upper surface P2. A portion at which bottom surface BT and side wall surface SW are connected to each other constitutes a corner portion, of trench TR. In the present embodiment, trench TR extends to constitute a mesh having a honeycomb structure when viewed in a plan view (see FIG. 23). Accordingly, silicon carbide layer 101 has upper surface P2 having a hexagonal shape and surrounded by trench TR.

Relaxation region 71 has p type conductivity. Relaxation region 71 is provided in first silicon carbide layer 10. Relaxation region 71 is separated from p base layer 82 by second epitaxial layer 81b. Moreover, relaxation region 71 is separated from each of side wall surface SW and bottom surface BT of trench TR. Preferably, relaxation region 71 is separated from p base layer 82 by not less than 1 μm and not more than 5 μm. A value obtained by integrating impurity concentrations based on a unit volume of relaxation region 71 in the thickness direction (vertical direction in FIG. 20) corresponds to a dose amount in the ion implantation for forming relaxation region 71. This dose amount is preferably not less than $1 \times 10^{12}$ cm$^{-2}$ and not more than $1 \times 10^{15}$ cm$^{-2}$, such as $1 \times 10^{13}$ cm$^{-2}$. The impurity included in relaxation region 71 is aluminum, for example. Relaxation region 71 is at least partially provided in a position deeper than the position of bottom surface BT of trench TR. Preferably, as shown in FIG. 20, relaxation region 71 is provided only in a position deeper than the position of bottom surface BT of trench TR.

Figure 23:
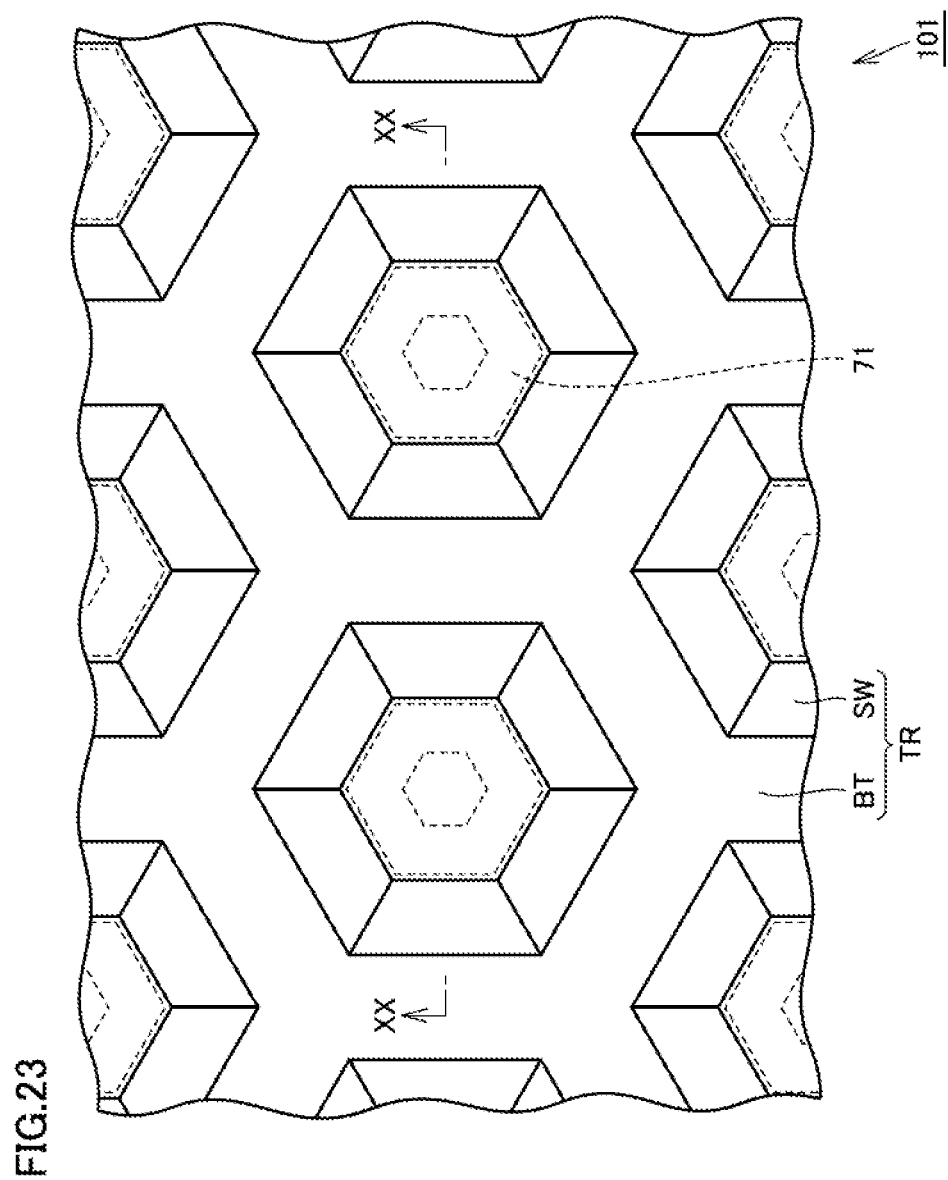
FIG. 23 is a schematic plan view schematically showing the structure of the silicon carbide layer.

When viewed in a plan view, relaxation region 71 is disposed at least partially outside bottom surface BT of trench TR. Preferably, as shown in FIG. 23, when viewed in a plan view, relaxation region 71 is disposed only outside bottom surface BT of trench TR. Preferably, when viewed in a plan view (FIG. 23), a distance between relaxation region 71 and bottom surface BT of trench TR is not less than 0.5 μm and not more than 5 μm.

Gate oxide film 91 covers each of side wall surface SW and bottom surface BT of trench TR. Gate electrode 92 is provided on gate oxide film 91. Source electrode 94 is in contact with each of n regions 83 and p contact region 84. Source interconnection layer 95 is in contact with source electrode 94. Source interconnection layer 95 is, for example, an aluminum layer. Interlayer insulating film 93 insulates between gate electrode 92 and source interconnection layer 95.

In the above-mentioned embodiment, it has been illustrated that silicon carbide semiconductor device 100 is a MOSFET but silicon carbide semiconductor device 100 is not limited to a MOSFET. Silicon carbide semiconductor device 100 may be a Schottky barrier diode or an IGBT (Insulated Gate Bipolar Transistor), for example. In the example, it has been illustrated that the first conductivity type is n type and the second conductivity type is p type, but the first conductivity type may be p type and the second conductivity type may be n type. In the above-mentioned embodiment, it has been illustrated that the step of performing alignment is used when forming the p contact region, but the step of performing alignment is not limited to the case where it is performed upon the formation of the p contact region. The step of performing alignment may be used in a step, such as a silicon carbide dry etching step, a gate electrode forming step, or an interlayer insulating film contact hole forming step.

Moreover, in the above-mentioned embodiment, it has been illustrated that second recess 2 is an alignment mark in the exposure process, but second recess 2 is not limited to the alignment mark in the exposure process as long as second recess 2 serves as an alignment mark. Second recess 2 may be an alignment mark used for a defect inspection step, a laser annealing step, or the like, for example.

Next, the following describes function and effect of the method for manufacturing MOSFET 100 according to the present embodiment.

According to the method for manufacturing MOSFET 100 according to the present embodiment, the ratio obtained by dividing depth D of first recess 1 by thickness T of second silicon carbide layer 20 is more than 0.2. Accordingly, there can be provided a method for manufacturing MOSFET 100 to allow for improved alignment precision.

Moreover, according to the method for manufacturing MOSFET 100 according to the present embodiment, a size X1 of an opening 1a of first recess 1 in an in-plane off direction is less than a size Y1 of opening 1a of first recess 1 in a direction perpendicular to the in-plane off direction. Accordingly, there can be provided a method for manufacturing MOSFET 100 to allow for effectively improved alignment precision.

Moreover, according to the method for manufacturing MOSFET 100 according to the present embodiment, size X1 of opening 1a of first recess 1 in in-plane off direction a11 is not less than 2 μm and not more than 15 μm. When size X1 of opening 1a is not less than 2 μm, first recess 1 can be effectively suppressed from being filled. Moreover, when size X1 of opening 1a is not more than 15 μm, opening end portion 1a1 of opening 1a facing opposite to in-plane off direction a11 can be suppressed from being reduced in angle.

Moreover, according to the method fir manufacturing MOSFET 100 according to the present embodiment, second recess 2 is an alignment mark used in an exposure process. Accordingly, in the exposure process, high alignment precision can be realized.

Moreover, according to the method for manufacturing MOSFET 100 according to the present embodiment, thickness T of second silicon carbide layer 20 is not less than 0.5 μm and not more than 5 μm. When thickness T of second silicon carbide layer 20 is not less than 0.5 μm, an effect of increase of on resistance can be suppressed from being strong. When thickness T of second silicon carbide layer 20 is not more than 5 μm, first recess 1 can be suppressed effectively from being filled. The electric field relaxation effect of relaxation region 71 can be maintained to be high.

Moreover, according to the method for manufacturing MOSFET 100 according to the present embodiment, in the step of forming first recess 1, first recess 1 is formed on a dicing line 3 of first main surface 10a By forming first recess 1 on the dicing line, alignment precision can be improved without decreasing an area in which a semiconductor element is formed.

Moreover, the method for manufacturing MOSFET 100 according to the present embodiment further includes a step of forming a first impurity region 71 in first silicon carbide layer 10 after the step of forming first silicon carbide layer 10. Accordingly, MOSFET 100 having relaxation region 71 can be obtained.

Moreover, the method for manufacturing MOSFET 100 according to the present embodiment further includes a step of forming a p contact region 84 and a source electrode 94 after the step of performing the alignment based on the image of second recess 2. Accordingly, alignment precision in p contact region 84 and source electrode 94 can be improved.

[Example]

Figure 3:
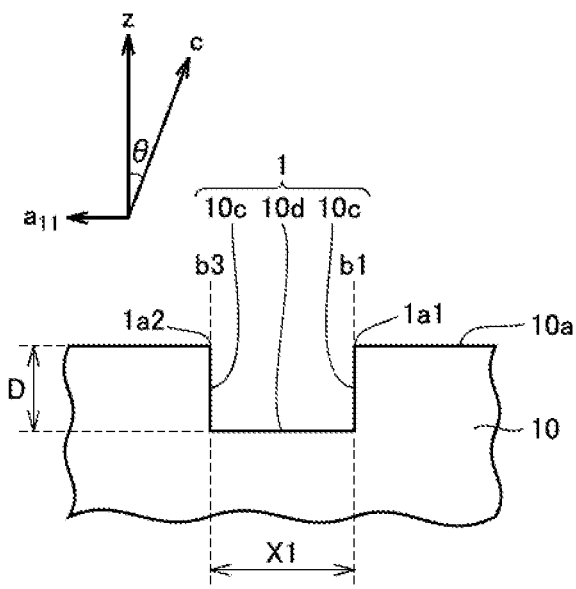
FIG. 3 is a schematic cross sectional view schematically showing a structure of a first recess.
Figure 24:
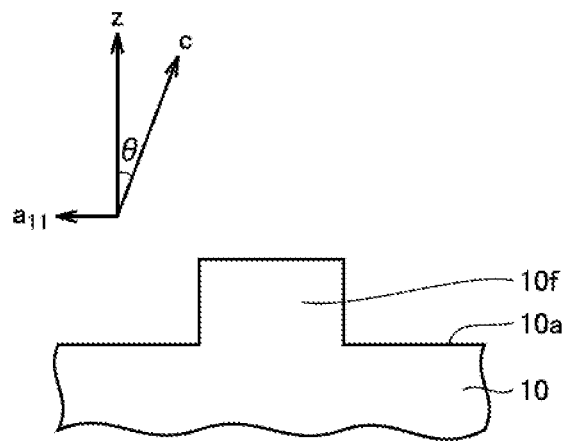
FIG. 24 is a schematic cross sectional view schematically showing a structure of a first projection according to a comparative example.
Figure 25:
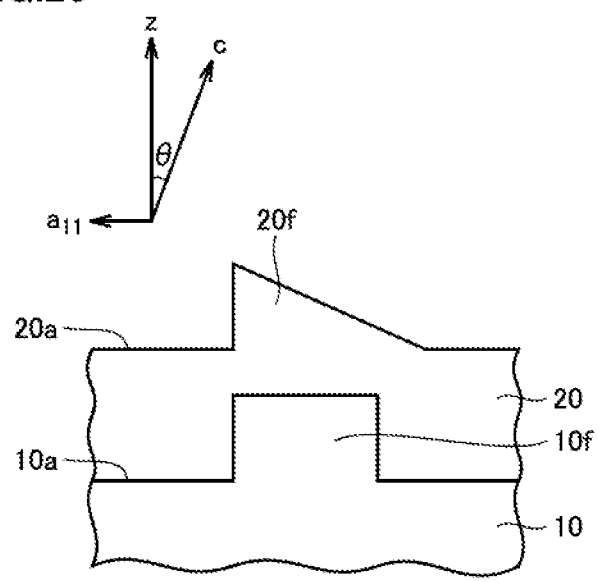
FIG. 25 is a schematic cross sectional view schematically showing a structure of a second projection according to a comparative example.

First, silicon carbide epitaxial substrates 10 (recess type substrate) were prepared each of which was provided with first recess 1 in first main surface 10a as shown in FIG. 3. Depth D of first recess 1 was set at 0.5 μm and 1.0 μm. Likewise, silicon carbide epitaxial substrates 10 (projection type substrates) were prepared each of which was provided with a first projection 10f at first main surface 10a as shown in FIG. 24. The height of first projection 10f was set at 0.5 μm and 1.0 μm. Next, silicon carbide epitaxial layer 20 having a thickness of 3 mm was formed on first main surface 10a of each of silicon carbide epitaxial substrates 10. When the recess type substrate was used, second recess 2 was formed at a position facing first recess 1 as shown in FIG. 9. When the projection type substrate was used, a second projection 20f was formed at a position facing first projection 10f as shown n in FIG. 25. In this way, the following two types of substrates were prepared: the substrate (projection type) according to a comparative example; and the substrate (recess type) according to the present invention's example. The substrates described above were introduced into an i-line stepper and were aligned using the LSA method and the FIA method, and alignment precision was inspected.

With reference to Table 1 and Table 2, the following describes results for alignment precision. Table 1 shows results for alignment precision when the LSA method was used, whereas Table 2 shows results for alignment precision when the FIA method was used.

TABLE 1

| Size | Projection Type | Recess Type |
| --- | --- | --- |
| 0.5 μm | Deviation of 2 to 3 μm to Right Side | Deviation of 2 to 3 μm to Right Side |

TABLE 1-continued

| Size | Projection Type | Recess Type |
|---|---|---|
| 1.0 μm | Deviation of 2 to 3 μm to Right Side | Deviation of 2 to 3 μm to Right Side |

TABLE 2

| Size | Projection Type | Recess Type |
|---|---|---|
| 0.5 μm | Unrecognizable | Unrecognizable |
| 1.0 μm | Unrecognizable | Within ±0.1 μm |

As shown in Table 1, when the LSA method was used, the alignment position was deviated by about 2 to 3 μm to one side (right side) in the case of each of the projection type substrate and the recess type substrate. No difference was found between the case where each of depth D of first recess 1 and the height of first projection 10f was 0.5 μm and the case where each of depth D of first recess 1 and the height of first projection 10f was 1.0 μm. When the alignment mark itself is deformed asymmetrically, a method employing reflection of light such as the LSA method presumably provides offset according to the deformed shape, thus resulting in uniform deviation to one side.

As shown in Table 2, when the TFA method was used and each of depth D of first recess 1 and the height of first projection 10f was 0.5 μm, the stepper could not recognize the alignment mark in the case of each of the projection type substrate and the recess type substrate before performing alignment. Moreover, for the projection type substrate having first projection 10f having a height of 1.0 μm, the stepper could not recognize the alignment mark. On the other hand, when depth D of first recess 1 was 1.0 μm, alignment precision was ±0.1 μm. This alignment precision was comparable to alignment precision guaranteed for a reference mark by the i-line stepper used for this experiment.

In this way, it was confirmed that the recess type is more preferable than the projection type as an alignment mark of a silicon carbide substrate. Moreover, it was confirmed that the FIA method is more preferable than the LSA method as an alignment method.

Next, alignment precision was checked by changing the depth of first recess 1 and thickness T of silicon carbide epitaxial layer 20 formed on first recess 1. Specifically, six types of silicon carbide substrates respectively including first recesses 1 having depths D of 0.6 μm, 0.7 μm, 0.8 μm, 0.9 μm, and 1.1 μm were prepared, and then silicon carbide epitaxial layer 20 having a thickness of 3 μm was formed on each of the silicon carbide substrates. Likewise, two types of silicon carbide substrates including first recesses 1 having depths D of 0.5 μm and 1.0 μm were prepared, and then silicon carbide epitaxial layer 20 having a thickness of 1.5 μm was formed on each of the silicon carbide substrates. Using the alignment marks formed in the eight types of silicon carbide substrates in total, alignment precision (read result) was inspected.

With reference to Table 3 and Table 4, the following describes results for alignment precision. Table 3 shows results for alignment precision when the thickness of silicon carbide epitaxial layer 20 was 3 μm, whereas Table 4 shows results for alignment precision when the thickness of silicon carbide epitaxial layer 20 was 1.5 μm. Here, the definitions of signs in the read results will be described. A sign "A" indicates that the alignment marks were read satisfactorily and there were little variations of alignment positions. A sign "B" indicates that the alignment marks could be read but there were variations of alignment positions to some extent. A sign "C" indicates that the alignment marks could not be read.

TABLE 3

| Depth (D) of First Recess | 0.6 μm | 0.7 μm | 0.8 μm | 0.9 μm | 1.1 μm |
|---|---|---|---|---|---|
| Thickness (T) of Second Silicon Carbide Layer | 3 μm | 3 μm | 3 μm | 3 μm | 3 μm |
| Ratio (D/T) | 0.20 | 0.23 | 0.27 | 0.3 | 0.37 |
| Read Result | C | B | A | A | A |

TABLE 4

| Depth (D) of First Recess | 0.5 μm | 1.0 μm |
|---|---|---|
| Thickness (T) of Second Silicon Carbide Layer | 1.5 μm | 1.5 μm |
| Ratio (D/T) | 0.33 | 0.67 |
| Read Result | A | A |

As shown in Table 3 and Table 4, it was confirmed that when a ratio obtained by dividing depth D of first recess 1 by the second silicon carbide layer (silicon carbide epitaxial layer) is more than 0.2 more specifically, when the ratio is not less than 0.23, the alignment marks can be read although there are variations of alignment positions to some extent. Moreover, it was confirmed that when the ratio is not less than 0.27, the alignment marks are read satisfactorily and there are little variations of alignment positions. Furthermore, it was confirmed that when the ratio is not less than 0.33, even if the thickness of silicon carbide epitaxial layer 20 is 1.5 μm, the alignment marks are read satisfactorily and there are little variations of alignment positions.

The embodiments and examples disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: first recess; 1a1, 1a2, 2a1, 2a2: opening end portion; 1a, 2a opening; 2: second recess; 3, 3a, 3b: dicing line; 4: orientation flat portion; 10: first silicon carbide layer (silicon carbide epitaxial substrate); 10a: first main surface; 10b: second main surface; 10c: side portion; 10d, 20d: bottom portion; 10f: first projection; 20: second silicon carbide layer (silicon carbide epitaxial layer); 20a: fourth main surface; 20b: third main surface; 20c: first side portion; 20e: second side portion; 20f: second projection; 40: mask layer; 71: relaxation region (first impurity region); 80: silicon carbide single crystal substrate; 81a: first epitaxial layer; 81b: second epitaxial layer; 82: p base layer; 83: n region; 84: p contact region (second impurity region); 91: gate oxide film; 92: gate electrode; 93: interlayer insulating film; 94: source electrode; 95: source interconnection layer; 98: drain electrode; 100: MOSFET; 101: silicon carbide layer; BT: bottom surface; P1: lower surface; P2: upper surface; SW: side wall surface; T: thickness; TQ: recess; TR: trench; W: width; e: space; a1: off direction; a11: in-plane off direction; b1, b2, b3: position; z: normal line vector.

The invention claimed is:

1. A method for manufacturing a silicon carbide semiconductor device, comprising steps of:
    preparing a first silicon carbide layer having a first main surface and a second main surface opposite to said first main surface;
    forming a first recess in said first main surface of said first silicon carbide layer, said first recess including a side portion continuously connected to said first main surface and a bottom portion continuously connected to said side portion;
    forming a second silicon carbide layer in contact with said first main surface, said side portion, and said bottom portion, said second silicon carbide layer having a third main surface in contact with said first main surface and a fourth main surface opposite to said third main surface;
    obtaining an image of a second recess formed in said fourth main surface at a position facing said first recess; and
    performing alignment based on said image of said second recess,
    said first main surface corresponding to a plane angled off relative to a {0001} plane such that a normal line vector of said first main surface has at least one of components of <11-20> and <1-100>,
    a ratio obtained by dividing a depth of said first recess by a thickness of said second silicon carbide layer being more than 0.2.

2. The method for manufacturing the silicon carbide semiconductor device according to claim 1, wherein a size of an opening of said first recess in an in-plane off direction is less than a size of said opening of said first recess in a direction perpendicular to said in-plane off direction.

3. The method for manufacturing the silicon carbide semiconductor device according to claim 2, wherein the size of the opening of said first recess in said in-plane off direction is not less than 2 μm and not more than 15 μm.

4. The method for manufacturing the silicon carbide semiconductor device according to claim 1, wherein said second recess is an alignment mark used in an exposure process.

5. The method for manufacturing the silicon carbide semiconductor device according to claim 1, wherein the thickness of said second silicon carbide layer is not less than 0.5 μm and not more than 5 μm.

6. The method for manufacturing the silicon carbide semiconductor device according to claim 1, wherein in the step of forming said first recess, said first recess is formed on a dicing line of said first main surface.

7. The method for manufacturing the silicon carbide semiconductor device according to claim 1, further comprising a step of forming a first impurity region in said first silicon carbide layer after the step of forming said first silicon carbide layer.

8. The method for manufacturing the silicon carbide semiconductor device according to claim 1, further comprising a step of forming at least one of a second impurity region and an electrode after the step of performing the alignment based on said image of said second recess.

* * * * *